United States Patent [19]
Fujiwara

[11] Patent Number: 5,879,976
[45] Date of Patent: Mar. 9, 1999

[54] THIN FILM TRANSISTOR AND METHOD FOR PRODUCING THE SAME

[75] Inventor: Masahiro Fujiwara, Nara, Japan

[73] Assignee: Sharp Kabushiki Kaisha, Osaka, Japan

[21] Appl. No.: 911,021

[22] Filed: Aug. 13, 1997

[30] Foreign Application Priority Data

Aug. 22, 1996 [JP] Japan .................................. 8-221599

[51] Int. Cl.⁶ ............................................... H01L 21/336
[52] U.S. Cl. ............................................ 438/163; 438/300
[58] Field of Search .................................... 438/163, 300, 438/151, 942, 949, 491, 155, 184, 201, 393, 439, 495; 257/347

[56] References Cited

U.S. PATENT DOCUMENTS

| | | | |
|---|---|---|---|
| 5,116,771 | 5/1992 | Karulker | 438/163 |
| 5,294,555 | 3/1994 | Mano et al. | 438/163 |
| 5,366,909 | 11/1994 | Song et al. | 438/163 |
| 5,439,836 | 8/1995 | Giffard | 438/163 |
| 5,485,028 | 1/1996 | Takahashi et al. | 257/347 |
| 5,567,966 | 10/1996 | Hwang | 257/347 |
| 5,658,805 | 8/1997 | Young | 438/151 |
| 5,700,700 | 12/1997 | Hwang | 438/163 |
| 5,726,081 | 3/1998 | Lin et al. | 438/163 |
| 5,789,283 | 8/1998 | Park | 438/163 |

FOREIGN PATENT DOCUMENTS

| | | |
|---|---|---|
| 06163899 A | 6/1994 | Japan . |
| 06163900 A | 6/1994 | Japan . |

*Primary Examiner*—Mary Wliczewski
*Attorney, Agent, or Firm*—Birch Stewart Kolasch & Birch, LLP

[57] ABSTRACT

A thin film transistor formed on an insulative substrate includes: a first semiconductor film including a channel region and first source/drain regions; a gate insulating film formed on the channel region of the first semiconductor film; a gate electrode formed on the gate insulating film; an insulating film formed on surfaces of the gate electrode; and a second semiconductor film formed on the first source/drain regions of the first semiconductor film. The second semiconductor film includes second source/drain regions which make contact with the first source/drain regions of the first semiconductor film, respectively, the second source/drain regions being separated above the gate electrode by a gap.

4 Claims, 5 Drawing Sheets

PRIOR ART

THIN FILM TRANSISTOR AND METHOD FOR PRODUCING THE SAME

BACKGROUND OF THE INVENTION

1. Field of the Invention

The present invention relates to a thin film transistor (hereinafter, simply referred to as a "TFT") suitable for use in an active matrix type liquid crystal display device (hereinafter, simply referred to as an "AMLCD"), an image sensor or the like, and a method for producing the same.

2. Description of the Related Art

Recently, a liquid crystal display has been receiving much attention as a flat panel display. Specifically, AMLCDs have been incorporated in televisions, projectors, notebook personal computers and the like due to their excellent display quality. In such an AMLCD, amorphous silicon (a-Si) TFTs are used as switching elements for pixels.

However, since the field effect mobility of the a-Si TFT is as low as about 1 $cm^2/V\cdot s$, the a-Si TFT is not usable to form a driving circuit. Therefore, it is necessary to mount, by employing a TAB (Tape Automated Bonding) technique or the like, integrated circuits as drivers along a periphery of a substrate where the switching transistors are formed to produce a display section.

On the other hand, the field effect mobility of a TFT made of polycrystalline silicon (poly-Si) can be as high as 100 $cm^2/V\cdot s$ or higher. Thus, the poly-Si TFT can be used to form a driving circuit that can be formed on the same substrate with the switching transistors. In particular, a TFT made of a low-temperature poly-Si, which can be fabricated through a process conducted at a temperature of 600° C. or lower, has been undergoing vigorous studies due to the fact that it can be formed on an inexpensive glass with a lower strain point.

Problems of the poly-Si TFT remaining to be solved include reduction in an off-current (i.e., a leakage current flowing between a source region and a drain region while the transistor is turned off) and enhancement of the current driving ability. In order to solve the above-mentioned problems, a thinner poly-Si film has been considered. A thinner poly-Si film allows an increase in the sheet resistance, thereby reducing the off-current. Moreover, the thinner poly-Si film allows complete depletion of the poly-Si film while the transistor is turned on, thereby reducing a threshold voltage $V_{TH}$ and enhancing the current driving ability.

However, the thinner poly-Si film increases the resistance of source/drain regions as well. Accordingly, the above-mentioned effect of enhancement in the current driving ability is contradicted. For example, a poly-Si film having an impurity concentration of about $10^{20} cm^{-3}$ has a sheet resistance of about several hundred $\Omega/\square$ when the thickness thereof is 100 nm, and a sheet resistance of about several $k\Omega/\square$ when the thickness thereof is 10 nm. Upon simulation, in the case where a TFT has a ratio of a channel length L and a channel width W (L/W) of about 10 $\mu m$/10 $\mu m$, the resistance of source/drain regions is preferably several hundred $\Omega$ or lower considering the high-speed operation required in a driving circuit. If the channel length of the TFT is shortened in order to realize further enhanced high-speed operation, it is necessary to further reduce the resistance of the source/drain regions. Accordingly, a TFT made of a thinner poly-Si film is not preferable because of deterioration in the current driving ability.

Figure 4:
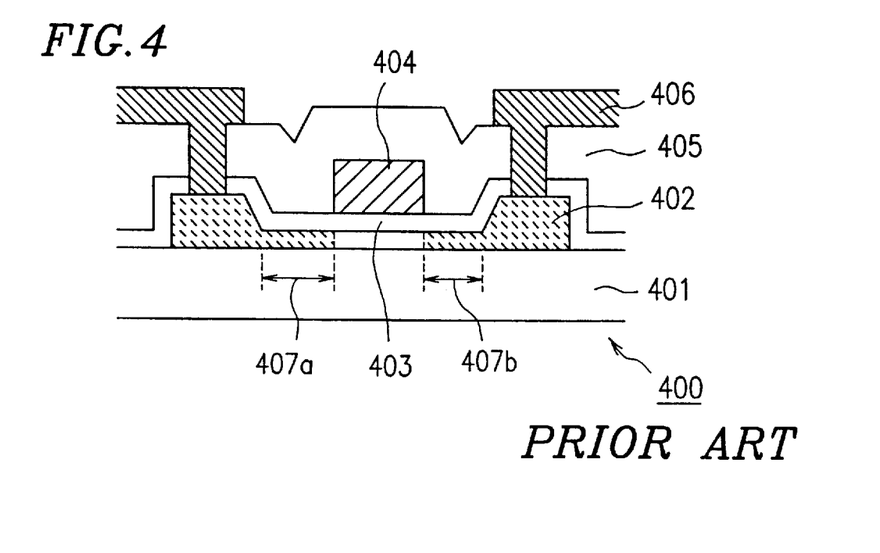
FIG. 4 is a cross-sectional view showing a conventional thin film transistor.

In order to solve the above-described problem, a TFT 400 shown in FIG. 4 has been proposed in which the source/drain regions are made relatively thick while a channel region is made relatively thin (Japanese Laid-Open Patent Publication Nos. 6-163899 and 6-163900).

The TFT 400 shown in FIG. 4 includes a poly-Si film 402 having a channel region and source/drain regions formed on a glass substrate 401, a gate insulating film 403 formed on the poly-Si film 402 and a gate electrode 404 formed on the gate insulating film 403. The TFT is characterized in that the thickness of the poly-Si film 402 is greater in the source/drain regions than in the channel region. In other words, the channel region is thinner than the source/drain regions.

The above-described structure is covered with an interlayer insulating film 405. Source/drain electrodes 406 are formed on the interlayer insulating film 405 so as to be electrically connected to the source/drain regions, respectively, via contact holes provided through the interlayer insulating film 405.

In such a conventional TFT, the step of forming the gate electrode 404 comes after the step of making the source/drain regions thick or the step of making the channel region thin. Accordingly, the relative location of the gate electrode 404 may be greatly offset depending on the accuracy of mask alignment for forming the gate electrode 404. Therefore, conventionally, it is difficult to form a TFT having dimensions in precise accordance with the design and with satisfactory reproducibility.

In the case where a glass substrate is used instead of a quartz substrate, it is difficult to form a plurality of TFTs on a large substrate with accuracy due to problems such as that the substrate may contract in size upon heating during the production process. In order to prevent variation in the transistor characteristics or malfunction in the transistor caused by the dislocation of the gate electrode, the gate electrode needs to be located on the channel region without fail, taking in consideration the process margins such as the accuracy of mask alignment. In order to do so, the plane area of the relatively thin channel region needs to be made large. As shown in FIG. 4, the relatively thin portion of the poly-Si film 402 (i.e., a thin film region) is formed so as to have a size sufficiently greater than the width of the gate electrode 404 along the channel length.

However, in such a structure, the entire area of the thin film region is not used as the channel region and the marginal portions are used as parts of the source/drain regions. Referring to FIG. 4, portions 407a and 407b of the thin film region are shown as the parts of the source/drain regions.

In such a structure, the sheet resistance (series resistance) of the source/drain regions is increased. In the case of a large substrate (e.g., 300 mm×400 mm), the process margin is about 2 to 4 $\mu m$. Accordingly, when L/W of the TFT is about 10 $\mu m$/10 $\mu m$, resistance increased due to the process margin is approximately 1 $k\Omega$ which is substantial.

As for the switching transistors, the resistance of the source/drain regions causes little problem, and it is rather important to reduce the off-current.

The off-current cannot be sufficiently reduced only by making the poly-Si film thinner. Accordingly, it has been considered to provide a structure having a substantially undoped region (i.e., an offset structure) or a structure having a lightly doped region (i.e., an LDD structure) between the gate electrode and the source/drain regions. Moreover, semiconductor regions with a bandgap larger than that of other semiconductor regions may be provided between the gate electrode and the source/drain regions.

An undoped region or a lightly doped region formed between the gate and the drain allows reduction in the off-current by easing the electric field concentration at the end of the drain. A semiconductor having a larger bandgap is effective in reducing the off-current due to its smaller carrier density at thermal equilibrium which results in high resistance.

Usually, the offset structure or the LDD structure is formed during the step of implanting ions for forming the source/drain regions, by masking portions to be the offset regions or the LDD regions with a resist. In order to locate semiconductor regions with a larger bandgap at prescribed regions, first, a semiconductor layer with a larger bandgap is deposited and then unnecessary portions of the semiconductor layer are selectively etched away.

The offset or LDD regions are formed (in vertical direction) from a semiconductor layer having a wide bandgap. For a TFT for switching a pixel, it is more important to lay stress on obtaining a lower off-current, whereas, for a TFT used for a driver, it is more important to lay stress on obtaining a higher on-current to enhance the driving ability thereof. Thus, in the case of using the TFT for a driver, it is preferable not to form the offset or LDD regions. It is, however, possible to form the offset or LDD layers when it is desired to improve the reliability of the TFT.

The offset regions, the LDD regions or the semiconductor regions with the larger bandgap are formed in a symmetrical manner with respect to the gate electrode. Otherwise, the on-current will be asymmetric with respect to positive and negative charges of a source-drain voltage, thereby causing problems such as variations in writing signals.

SUMMARY OF THE INVENTION

In accordance with one aspect of the present invention, a thin film transistor formed on an insulative substrate includes: a first semiconductor film including a channel region and first source/drain regions; a gate insulating film formed on the channel region of the first semiconductor film; a gate electrode formed on the gate insulating film; an insulating film formed on surfaces of the gate electrode; and a second semiconductor film formed on the first source/drain regions of the first semiconductor film. The second semiconductor film includes second source/drain regions which make contact with the first source/drain regions of the first semiconductor film, respectively, the second source/drain regions being separated above the gate electrode by a gap.

In one embodiment of the present invention, parts of the second semiconductor film oppose side surfaces of the gate electrode via the insulating film formed on the surfaces of the gate electrode.

In another embodiment of the present invention, the gap of the second semiconductor film is formed in a self-aligning manner with respect to the gate electrode.

In still another embodiment of the present invention, the second semiconductor film has a heavily doped impurity region at the surface, and either an undoped region or a lightly doped impurity region at the portion of the second semiconductor film where it makes contact with the first source/drain regions of the first semiconductor film.

In still yet another embodiment of the present invention, the second semiconductor film includes a multilayered structure including a first layer having the lightly doped impurity region and a second layer having the heavily doped impurity region.

In yet another embodiment of the present invention, the first semiconductor film is formed of a polycrystalline silicon and the second semiconductor film includes a semiconductor layer having a bandgap larger than a bandgap of the polycrystalline silicon.

According to another aspect of the present invention, a method for producing a thin film transistor, includes the steps of: forming a first semiconductor film on an insulative substrate which is light transmissive; forming a gate insulating film on the first semiconductor film; forming a gate electrode on the gate insulating film; forming an insulating film on surfaces of the gate electrode; depositing a second semiconductor film so as to make contact with an exposed surface of the first semiconductor film; forming a negative resist on the second semiconductor film; patterning the resist by exposing the negative resist to light radiated toward a bottom surface of the insulative substrate so as to remove at least a portion of the negative resist above the gate electrode; and etching the second semiconductor film while using the negative resist as a mask so as to leave the second semiconductor film at portions on both sides of the gate electrode in a self-aligning manner.

In one embodiment of the present invention, the insulating film on the surfaces of the gate electrode is formed by anodization or thermal oxidation.

In another embodiment of the present invention, the first semiconductor film and the second semiconductor film are made of polycrystalline silicon.

In still another embodiment of the present invention, the first semiconductor film is made of polycrystalline silicon and the second semiconductor film includes a semiconductor layer having a bandgap larger than a bandgap of the polycrystalline silicon.

Thus, the invention described herein makes possible the advantages of providing (1) a thin film transistor (TFT) in which current driving ability is enhanced by decreasing the resistance of source/drain regions while reducing an off-current of the TFT, and (2) a method for producing the TFT.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

(Example 1)

A TFT 100 according to a first example of the present invention will be described with reference to FIGS. 1A through 1H, and FIGS. 5 and 6.

Figure 1A:
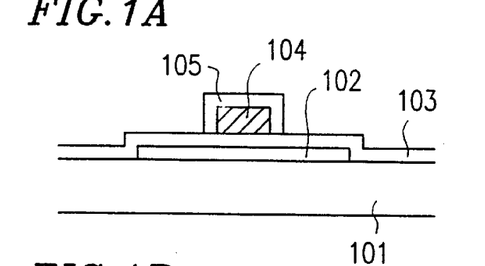
FIGS. 1A through 1H are cross-sectional views illustrating the steps for producing a thin film transistor according to a first example of the present invention.
Figure 1B:
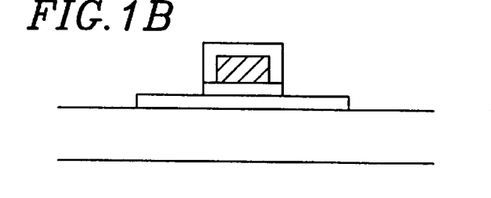
Figure 1C:
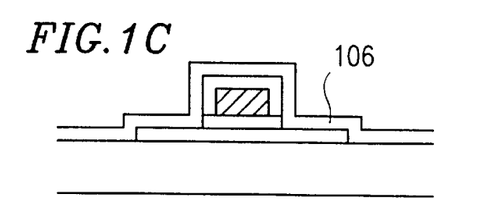
Figure 1D:
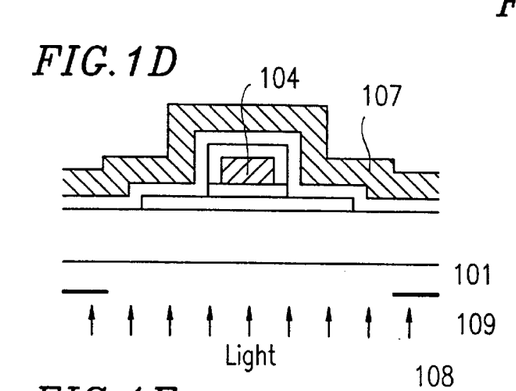
Figure 1E:
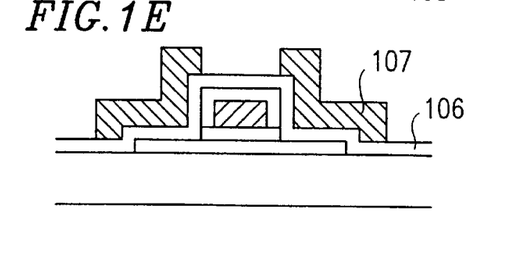
Figure 1F:
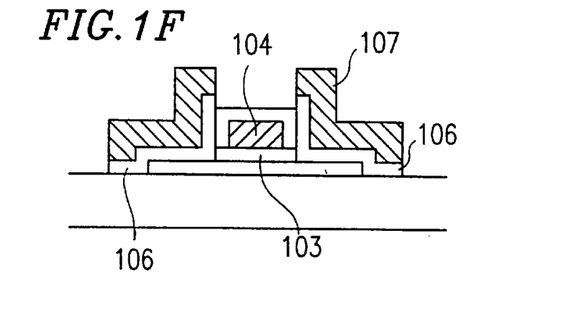
Figure 1G:
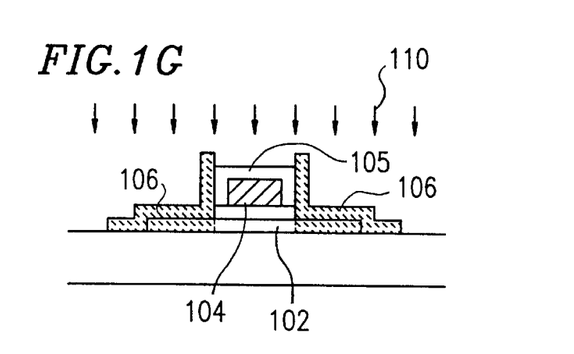
Figure 1H:
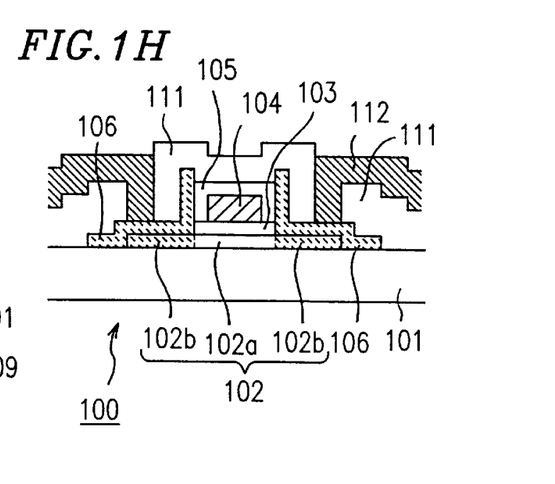

FIG. 1H is a cross-sectional view schematically illustrating the structure of the TFT 100 according to the first example of the present invention. The TFT 100 includes a first poly-Si film 102 having a channel region 102a and source/drain regions 102b formed on a glass substrate 101, a gate insulating film 103 formed on the channel region 102a of the first poly-Si film 102, a gate electrode 104 formed on the gate insulating film 103, an insulating film 105 formed on the surfaces of the gate electrode 104 and second poly-Si film portions 106 formed on the source/drain regions 102b of the first poly-Si film 102.

The second poly-Si film portions 106 include second source/drain regions making contact with the source/drain regions 102b of the first poly-Si film 102, the second source/drain regions being separated above the gate electrode 104 by a gap. Parts of the second poly-Si film portions 106 are formed on the side surfaces of the gate electrode 104 via the insulating film 105.

According to the present invention, the source/drain regions consist of the source/drain regions 102b of the first poly-Si film 102 and the second source/drain regions of the second poly-Si film 106 making contact therewith. Accordingly, the entire structure (including the marginal portions) of the source/drain regions is formed so as to be thicker than the channel region 102a.

The above-described structure is covered with an interlayer insulating film 111. Source/drain electrodes 112 made from an aluminum thin film are formed on the interlayer insulating film 111 so as to be electrically connected to the source/drain regions via contact holes provided through the interlayer insulating film 111.

Next, a method for producing the above-described TFT 100 will be described with reference to FIGS. 1A through 1H.

With reference to FIG. 1A, first, an $SiO_2$ film (not shown), as a buffer layer, is deposited on the light transmissive glass substrate 101 to a thickness of about 300 nm by sputtering. Then, an a-Si film (not shown) (thickness: 20 nm) is deposited on the $SiO_2$ film by a low pressure chemical vapor deposition (LPCVD) method using $Si_2H_6$. The substrate temperature at the time of the above-described deposition is set at 450° C. Subsequently, the a-Si film is crystallized by laser annealing using an excimer laser so as to obtain the first poly-Si film 102. The energy density of the laser is set to 250 $mJ/cm^2$ and the substrate temperature upon annealing is set to 200° C. Thereafter, the poly-Si film 102 is patterned into an island-like shape by photolithography and etching. Although only one island-like poly-Si film 102 is shown in FIGS. 1A through 1H, a plurality of islands are formed on the glass substrate 101 from a single continuous poly-Si film 102. In order to reduce the off-current of the transistor, the thickness of the first poly-Si film 102 is preferably in the range of about 10 nm to about 200 nm.

Then, an $SiO_2$ film (thickness: 100 nm) to be the gate insulating film 103 is deposited by employing a TEOS plasma chemical vapor deposition (PCVD) method. The resultant substrate is then subjected to annealing at a temperature of 600° C. for 12 hours in order to condense the gate insulating film 103.

Next, a Ta film is deposited to a thickness of 350 nm and patterned so as to form the gate electrode 104. Subsequently, the insulating film 105 is formed on the surfaces of the gate electrode 104. In the case of a TFT as Sample 1, the insulating film 105 is formed by an anodic oxidation method. In the case of a TFT as Sample 2, instead of the anodic oxidation method, the insulating film 105 is formed by a thermal oxidation method in an oxygen atmosphere at a temperature of 550° C. As a result, a structure shown in FIG. 1A is obtained. Other than the above-described anodic oxidation method or thermal oxidation method, the insulating film 105 can be formed by any method as long as the insulating film 105 is formed on the surfaces of the gate electrode 104 in a self-aligning manner.

Thereafter, exposed portions of the gate insulating film 103 are etched away by dry etching using $CHF_3$ so as to expose the surface of the poly-Si film 102 as shown in FIG. 1B. The step of etching the gate insulating film 103 may come either before or after the step of forming the insulating film 105 on the surfaces of the gate electrode 104 as long as no problems are caused by such a process.

As shown in FIG. 1C, the second poly-Si film 106 (thickness: 50 nm) is deposited by an LPCVD method using $SiH_4$. A substrate temperature at the time of the deposition is set to be about 600° C.

As shown in FIG. 1D, a negative resist 107 is applied on the second poly-Si film 106 using a photolithography technique. Thereafter, the negative resist 107 is exposed to light 108 radiated toward the bottom surface of the glass substrate 101. A photomask 109 is placed between the bottom surface of the glass substrate 101 and the light source so as to partially shield the light 108 emitted from the light source. The photomask 109 has a pattern such that regions each including the island-like poly-Si film 102 are irradiated with the light 108 while regions between adjacent poly-Si films 102 are not irradiated with the light 108.

The gate electrode 104 made of a light shielding material is located between the resist 107 and the light source, thereby acting as a kind of photomask against the exposure light 108 radiated toward the bottom surface of the substrate 101. Therefore, not only the portion of the negative resist 107 above the photomask 109 but also the portion of the negative resist 107 above the gate electrode 104 is not irradiated with light. After the above-described exposure process, the usual development procedure is performed so as to leave the exposed portions of the negative resist 107 on the substrate 101. In such a manner, the pattern that is self-aligned with the pattern of the gate electrode 104 is transferred to the negative resist 107, thereby obtaining the structure shown in FIG. 1E.

The exposure to the light 108 radiated toward the bottom surface of the substrate 101 is conducted, for example, at an exposure of 200 to 300 $mJ/cm^2$ using a mercury lamp (with no wavelength selection) as a light source. Wavelength selection for the light 108 emitted from the light source is not necessary unless the patterning is so accurate that the patterning is within 1 $\mu m$ or less. The amount of exposure is selected according to the type and thickness of the resist.

In the above-described process, exposure of the negative resist 107 is completed only by exposure to the light 108 directed to the bottom surface of the substrate. Alternatively, the above-described exposure may be combined with a usual exposure. Specifically, in the above-described exposure step wherein the pattern which is self-aligned with the pattern of the gate electrode 104 is transferred to the negative resist 107, the pattern of the photomask 109 may be transferred to the negative resist 107 by placing the photomask 109 on the substrate and then conducting a usual exposure. The above-described method for patterning the second semiconductor film is also used in the other examples of the present invention.

Then, by dry etching using $CF_4+O_2$, the portions of the second poly-Si film 103 which are not masked with the resist 107 are removed so as to obtain the second poly-Si film portions 106 as shown in FIG. 1F. Due to this patterning, the second poly-Si film portions 106 are separated from each other above the gate electrode 104 by a gap.

As shown in FIG. 1G, phosphorous ions ($P^+$) 110 of $1 \times 10^{15} cm^{-2}$ are implanted into parts of the poly-Si film 102 and to the poly-Si film 106 at an acceleration voltage of 40 kV employing an ion doping technique. Thereafter, annealing to activate the impurity is performed by excimer laser so as to form n-type source/drain regions. Laser annealing is conducted with the substrate temperature at room temperature and the energy density of the laser beam at 250 mJ/cm².

According to the first example, the ion implantation and the impurity activation are conducted after patterning the second poly-Si film 106. Alternatively, the above-described ion implantation and impurity activation may be conducted before the patterning process. In the case of forming p-type source/drain regions, p-type impurity ions are implanted. Moreover, in the case of forming both N-channel type transistor and P-channel type transistor on the same substrate, impurity ions of each conductivity type are selectively implanted into the corresponding source/drain regions of the transistors.

Substantially no impurity ions are implanted into regions beneath the insulating film 105 that is adjacent to the side walls of the gate electrode 104. However, when the thickness of the insulating film 105 is about 100 nm or less, the impurity ions will eventually reach the region beneath the insulating film 105 due to wraparound of obliquely implanted ions or due to thermal diffusion after the ion implantation. Thus, an offset region is hardly formed. A structure where the offset region is intentionally formed will be described in other examples.

As shown in FIG. 1H, an interlayer insulating film 111 (thickness: 400 nm) made of $SiO_2$ is deposited by a TEOS-PCVD method. Contact holes are provided through the prescribed portions of the interlayer insulating film 111 so as to partially expose the source/drain regions. Thereafter, the source/drain electrodes 112 are formed on the interlayer insulating film 111 so as to electrically make contact with the source/drain regions via the contact holes. Finally, both TFTs as Samples 1 and 2 are subjected to a hydrogen sintering in a hydrogen atmosphere for 2 hours with the substrate temperature at 350° C.

Figure 5:
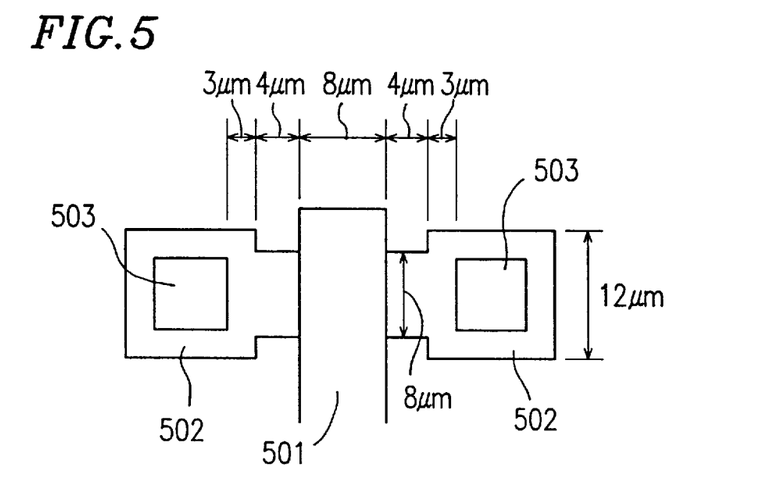
FIG. 5 is a plan view showing an exemplary layout of a thin film transistor according to the first example of the present invention.

FIG. 5 is a plan view showing the TFT according to the first example of the present invention. Referring to FIG. 5, the portions of the poly-Si film 502 where the source/drain contact regions 503 are to be formed are formed so as to have a width (12 μm) greater than the width (8 μm) of the rest of the poly-Si film 502. The size of each of the source/drain contacts 503 is 6 μm×6 μm.

The width of the gate electrode 501 which defines the channel length of the transistor is 8 μm. The gate electrode 501 is positioned so as to extend across the center portion of the poly-Si film 502 with a width of 8 μm (the length of the center portion of the poly-Si film 502 is 16 μm along the channel length).

A TFT (Sample 3) as a comparative example having a conventional structure was fabricated as shown in FIG. 4.

First, a poly-Si film (thickness: 50 nm) was deposited on a substrate by an LPCVD method using $SiH_4$. Then, the poly-Si film was etched so as to leave portions to be source/drain regions.

Thereafter, another poly-Si film (thickness: 20 nm) to be a channel region was deposited; a gate insulating film 403 was formed; and then a gate electrode 404 was formed. Ion doping, impurity activation and the like were conduced in the same manner as the TFTs according to the first example of the present invention. Similarly, the steps following the step of forming the interlayer insulating film were also conducted in the same manner as the TFTs according to the first example of the present invention.

The sheet resistance of the double-layered portion (thickness: 70 nm=50 nm+20 nm) of the above-described poly-Si films was about 300 Ω/□ whereas the sheet resistance of the single-layered portion (thickness: 20 nm) was about 1.5 kΩ/□.

Thin film regions 407a and 407b of the source/drain regions of Sample 3 (comparative example) each had a length of 3 μm and a channel width of 8 μm. The resistance of the source/drain regions was about 1.3 kΩ when estimated based on the above-mentioned sheet resistance. On the other hand, the resistance of the source/drain regions of the TFT according to the present invention is 400 Ω.

Figure 6:
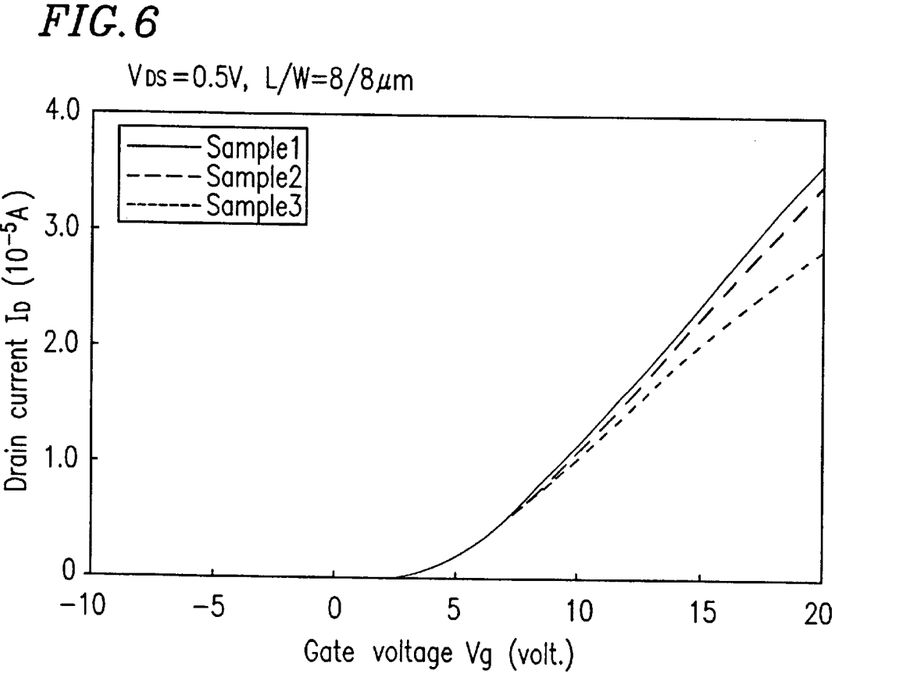
FIG. 6 is a graph showing $I_D$–$V_G$ characteristics of thin film transistors according to the first example of the present invention and a thin film transistor as a comparative example.

FIG. 6 is a graph showing $I_D$–$V_G$ curves obtained by measuring the TFTs as Samples 1 to 3. The vertical axis of the graph represents the drain current $I_D$ that flows between the source region and the drain region of the transistor. The horizontal axis represents the gate voltage $V_G$ of the transistor.

Generally, an approximation expression of a drain current $I_D$ obtained at a linear region of a transistor is represented by the following expression 1.

$$I_D = \mu \cdot C_{OX} \cdot W/L \cdot (V_G - V_{TH}) \cdot V_{DS} \qquad \text{... Expression 1}$$

where $\mu$ represents a field effect mobility; $C_{OX}$ represents a gate capacitance; $V_{TH}$ represents a threshold voltage; L represents a channel length of the TFT; $V_{DS}$ represents a source-drain voltage; and W represents a channel width of the TFT.

When the resistance of the source/drain regions is negligible, the drain current $I_D$ is proportional to the gate voltage $V_G$ and the source-drain voltage $V_{DS}$. Thus, assuming that the channel region has resistance that is inversely proportional to $V_G$, an approximation expression of the drain current $I_D$ will be represented by the following expression 2.

$$I_D = V_{DS}/(R_{S/D} + R_{ON}) \qquad \text{... Expression 2}$$

where $R_{S/D}$ represents resistance of the source/drain regions; and $R_{ON}$ represents resistance of the channel region.

When the gate voltage $V_G$ increases, the resistance $R_{ON}$ of the channel region decreases. In this case, as can be appreciated from Expression 2, the proportion of the resistance $R_{S/D}$ in the total resistance becomes significant. Thus, the increase in the drain current $I_D$ tends to become saturated as the gate voltage $V_C$ increases. The smaller the resistance $R_{S/D}$ of the source/drain regions is, the longer the proportional relationship (linear relationship) between the drain current $I_D$ and the gate voltage $V_G$ is maintained toward higher gate voltage $V_G$.

FIG. 6 shows data obtained when L/W is 8 μm/8 μm and when the source-drain voltage $V_{DS}$ is 0.5 volt. As can be appreciated from FIG. 6, in the case of Sample 3 (the comparative example), the linear relationship between the drain current $I_D$ and the gate voltage $V_G$ is maintained in a region where the gate voltage $V_G$ is 10 V or less but no longer maintained once the gate voltage $V_G$ exceeds about 10 V. On the other hand, in the case of Samples 1 and 2, the linear relationship between the drain current $I_D$ and the gate voltage $V_G$ is maintained until the gate voltage $V_G$ reaches the vicinity of 20 V. This implies that in the TFTs as Samples 1 and 2, sufficiently low resistance $R_{S/D}$ is formed. There is no significant difference between Samples 1 and 2.

(Example 2)

Figure 2:
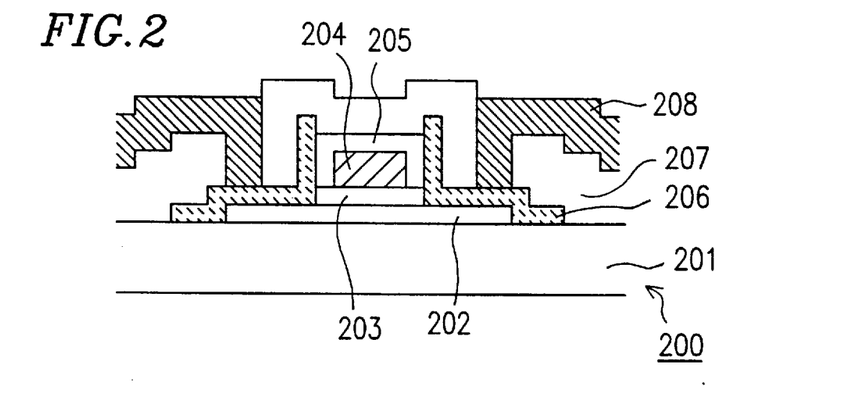
FIG. 2 is a cross-sectional view showing a thin film transistor according to a second example of the present invention.

Hereinafter, a TFT 200 according to a second example of the present invention will be described with reference to FIG. 2.

The TFT 200 according to the second example of the present invention includes a first poly-Si film 202 having a channel region and source/drain regions formed on a glass substrate 201, a gate insulating film 203 formed on the channel region of the first poly-Si film 202, a gate electrode 204 formed on the gate insulating film 203, an insulating film 205 formed on the surfaces of the gate electrode 204 and second poly-Si film portions 206 formed on the source/drain regions of the first poly-Si film 202. The above-described structure is covered with an interlayer insulating film 207. Source/drain electrodes 208 are formed on the interlayer insulating film 207 so as to be electrically connected to the source/drain regions via contact holes provided through the interlayer insulating film 207.

The TFT 200 according to the second example of the present invention differs from the TFT 100 according to the first example in that a second poly-Si film to be the second poly-Si film portions 206 is already doped with impurities at the step of deposition.

Hereinafter, a method for producing the TFT 200 as Sample 4 will be described.

The production process of the TFT 200 as Sample 4 is the same as the production process of TFT 100 described in the first example until the step of etching the gate insulating film 203. Then, as the second semiconductor film portions 206, an n⁺-type a-Si film (thickness 50 nm) heavily doped with phosphorous is deposited by a PCVD method using a mixed gas of SiH₄ and PH₃ (PH₃/SiH₄=0.01).

A negative resist is applied on the n⁺-type a-Si film and patterned in a self-aligning manner with respect to the gate electrode 204 by exposing the negative resist to light radiated toward the bottom surface of the substrate. Then, the n⁺-type a-Si film is etched by dry etching using CF₄+O₂. Thereafter, the n⁺-type a-Si film is polycrystallized by annealing using an excimer laser. The rest of the steps are the same as those according to the first example. The resulting sheet resistance of the source/drain regions according to the second example of the present invention is about 250 Ω/□.

Figure 7:
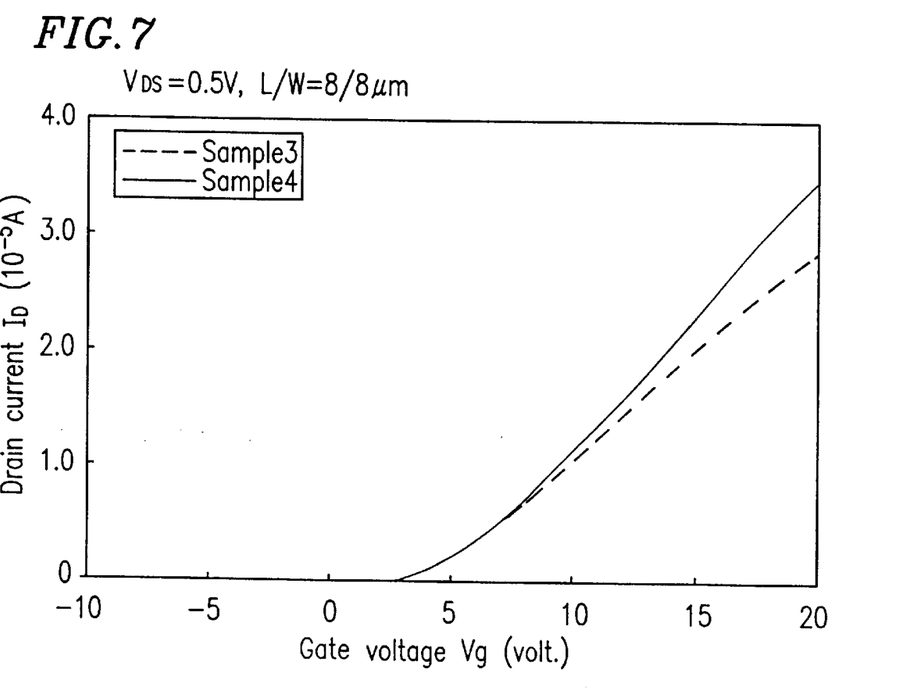
FIG. 7 is a graph showing $I_D$–$V_G$ characteristics of the thin film transistor according to the second example of the present invention and the thin film transistor as the comparative example.

FIG. 7 is a graph showing $I_D$–$V_G$ curves obtained for Samples 3 and 4. Similar to the characteristics of the TFT 100 according to the first example shown in FIG. 6, the drain current $I_D$ of Sample 4 linearly increases proportionally to the gate voltage $V_G$ until it reaches a region where the gate voltage $V_G$ is as high as about 20 V.

According to the second example of the present invention, in order to obtain the second semiconductor film (poly-Si film) portions 206, an n⁺-type a-Si film is deposited which is then crystallized by laser annealing. Alternatively, the second semiconductor film portions 206 may be obtained by depositing an n⁺-type poly-Si film that is already polycrystallized by an LPCVD method using SiH₄ and PH₃.

(Example 3)

Figure 3:
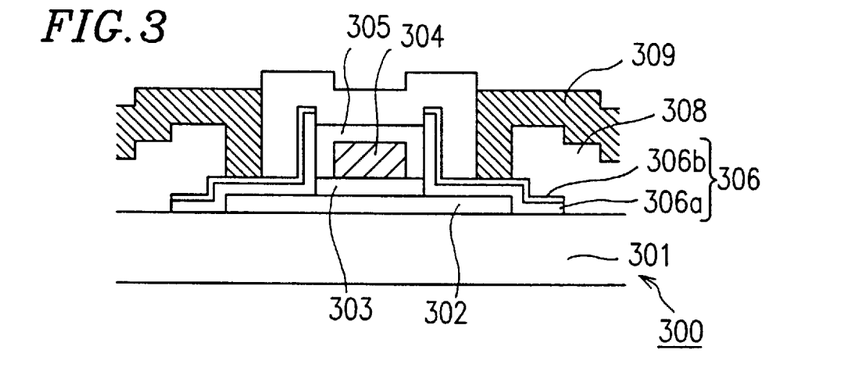
FIG. 3 is a cross-sectional view showing a thin film transistor according to a third example of the present invention.

Hereinafter, a TFT 300 according to a third example of the present invention will be described with reference to FIG. 3.

The TFT 300 according to the third example of the present invention includes a first semiconductor film (poly-Si film) 302 having a channel region and source/drain regions formed on a glass substrate 301, a gate insulating film 303 formed on the channel region of the poly-Si film 302, a gate electrode 304 formed on the gate insulating film 303, an insulating film 305 formed on the surfaces of the gate electrode 304 and second semiconductor film portions 306 formed on the source/drain regions of the poly-Si film 302.

The second semiconductor film portions 306 include second source/drain regions making contact with the source/drain regions of the first semiconductor film 302, the second source/drain regions being separated above the gate electrode 304 by a gap. Each of the second semiconductor film portions 306 has a portion where it opposes the side surface of the gate electrode 304 via the insulating film 305.

The TFT 300 according to the third example is characterized by the second semiconductor film portions 306 each having a double-layered structure of a lower semiconductor layer 306a and an upper semiconductor layer 306b.

The above-described structure is covered with an interlayer insulating film 308. Source/drain electrodes 309 are formed on the interlayer insulating film 308 so as to be electrically connected to the source/drain regions via contact holes provided through the interlayer insulating film 308.

Hereinafter, a method for producing the above-described TFT 300 will be described.

The production process of the TFT 300 is substantially the same as that of the TFT 100 described in the first example until the step of etching the gate insulating film 303.

Then, in a TFT as Sample 5, an undoped poly-Si film (thickness: 40 nm) is deposited by an LPCVD method using SiH₄ and subsequently an n⁺-type poly-Si film (thickness: 10 nm) is deposited using a mixed gas of SiH₄ and PH₃ (PH₃/SiH₄=0.05). As a result, the lower layer (the first layer) 306a of the second semiconductor film 306 is made from an undoped layer and the upper layer (the second layer) 306b of the second semiconductor film 306 is made from a heavily doped layer. In such a manner, offset regions can be formed between a region beneath the gate electrode 304 and the source/drain regions. The length of the offset regions along the channel length is generally equal to the sum of the thickness of the insulating film 305 formed on the surfaces of the gate electrode 304 and the thickness of the lower layer 306a of the second semiconductor film 306.

Furthermore, by using a lightly doped layer as the lower layer 306a of the second semiconductor film 306 and a heavily doped layer as the upper layer 306b, an LDD structure can be formed at the end of each of the source/drain regions while forming an offset region beneath the gate electrode 304. The length of the offset region along the channel length is defined by the thickness of the insulating film 305 formed on the surfaces of the gate electrode 304 and the length of the LDD along the channel length is defined by the thickness of the lightly doped layer. By providing such an LDD structure, the off-current can be decreased.

In another TFT as Sample 6, an undoped a-Si film (thickness: 30 nm) is deposited by a PCVD method using SiH₄ and subsequently an n⁺-type μc-Si film (thickness: 20 nm) is deposited by using a mixed gas of SiH₄ and PH₃.

As a result, the first semiconductor film 302 is made of poly-Si (bandgap: 1.16 eV), and at least a portion of the second semiconductor film where it makes contact with the first semiconductor film is made from a semiconductor layer having a larger bandgap such as a-Si (bandgap: about 1.6 to 1.7 eV). Accordingly, a semiconductor layer with a larger bandgap can be provided between the source/drain regions and the first semiconductor film in a self-aligning manner. As a result, the off-current can be reduced.

As a material having a bandgap larger than the bandgap of the poly-Si, other than a-Si, $SiC_x$ ($0<x\leq1$: bandgap about 1.7 to 2.2 eV), $SiN_x$ ($0<x<4/3$: bandgap>about 1.7 eV), $SiO_x$ ($0<x<2$: bandgap>about 1.7 eV) and the like are available.

After forming the second semiconductor film 306, a resist is patterned in a self-aligning manner with respect to the gate electrode 304. Then, the Si film is etched by dry etching using $CF_4+O_2$.

Subsequently, in the case of a TFT as Sample 5, an $SiO_2$ film is formed as the interlayer insulating film 308 by a TEOS-PCVD method in the same manner as the first example. In the case of a TFT as Sample 6, the $SiO_2$ film is formed by sputtering. Thereafter, contact holes are provided and the source/drain electrodes are made of Al. Finally, Samples 5 and 6 are subjected to hydrogenation for 2 hours at substrate temperatures of 350° C. and 250° C., respectively. The sheet resistance of the source/drain regions are 2 k$\Omega$/□ in Sample 5 and 100 k$\Omega$/□ in Sample 6.

Figure 8:
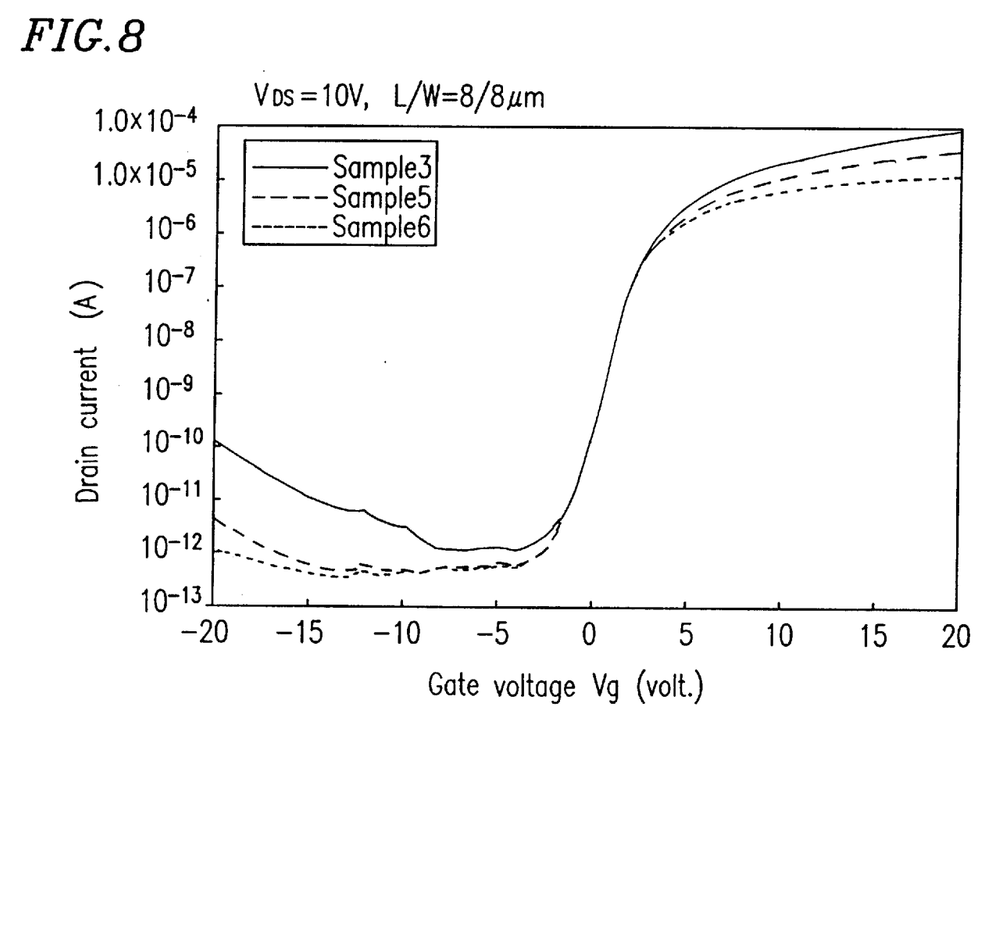
FIG. 8 is a graph showing $I_D$–$V_G$ characteristics of thin film transistors according to a third example of the present invention and the thin film transistor as the comparative example.

FIG. 8 is a graph showing $I_D$–$V_G$ curves obtained for Samples 3, 5 and 6. As can be understood from the graph, although the on-currents of Samples 5 and 6 are significantly decreased as compared to those of Samples 1 to 4, the off-currents are decreased. This is due to the presence of the offset regions and the high resistance of the source/drain regions. Accordingly, it can be appreciated that the TFT according to the third example (i.e., Samples 5 and 6) is particularly suitable as a switching element for a pixel.

According to the present invention, the resistance of the source/drain regions is decreased by using a second semiconductor film together with a first semiconductor film including a channel region and source/drain regions. Accordingly, the current driving ability of the transistor can be enhanced.

Moreover, by employing a second semiconductor film having a double-layered structure, the off-current can be decreased. Accordingly, a driving-circuit-integrated-type liquid crystal panel can be realized.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a thin film transistor, comprising the steps of:
    forming a first semiconductor film on an insulative substrate which is light transmissive;
    forming a gate insulating film on the first semiconductor film;
    forming a gate electrode on the gate insulating film;
    forming an insulating film on surfaces of the gate electrode;
    depositing a second semiconductor film so as to make contact with an exposed surface of the first semiconductor film;
    forming a negative resist on the second semiconductor film;
    patterning the resist by exposing the negative resist to light radiated toward a bottom surface of the insulative substrate so as to remove at least a portion of the negative resist above the gate electrode; and
    etching the second semiconductor film while using the negative resist as a mask so as to leave the second semiconductor film at portions on both sides of the gate electrode in a self-aligning manner.

2. A method for producing a thin film transistor according to claim 1, wherein the insulating film on the surfaces of the gate electrode is formed by anodization or thermal oxidation.

3. A method for producing a thin film transistor according to claim 1, wherein the first semiconductor film and the second semiconductor film are made of polycrystalline silicon.

4. A method for producing a thin film transistor according to claim 1, wherein the first semiconductor film is made of polycrystalline silicon and the second semiconductor film includes a semiconductor layer having a bandgap larger than a bandgap of the polycrystalline silicon.

* * * * *